(12) United States Patent
Matsui et al.

(10) Patent No.: US 6,883,933 B2
(45) Date of Patent: Apr. 26, 2005

(54) LIGHTING APPARATUS WHOSE LIGHT EMITTING ELEMENTS ARE HARD TO BE TAKEN OFF

(75) Inventors: Nobuyuki Matsui, Takatsuki (JP); Hideo Nagai, Takatsuki (JP); Tetsushi Tamura, Takatsuki (JP); Kenzo Hatada, Katano (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 10/245,019

(22) Filed: Sep. 17, 2002

(65) Prior Publication Data

US 2003/0052594 A1 Mar. 20, 2003

(30) Foreign Application Priority Data

Sep. 18, 2001 (JP) ........................................ 2001-284107

(51) Int. Cl.$^7$ .............................................. F21V 21/04
(52) U.S. Cl. ........................ 362/231; 362/545; 362/800
(58) Field of Search ................................. 362/543–555, 362/800, 237, 249; 313/495; 174/254, 258; 361/749, 737

(56) References Cited

U.S. PATENT DOCUMENTS

2002/0006040 A1 * 1/2002 Kamada et al. ............. 362/237

* cited by examiner

Primary Examiner—Alan Cariaso
Assistant Examiner—Guiyoung Lee

(57) ABSTRACT

In the present invention, a plurality of concaves are provided for one main surface of a flexible substrate by press-forming. Each concave has a flat surface which is substantially parallel to the main surface of the substrate, and mounted on the flat surface are three LEDs each emitting colored light of red, green, and blue respectively.

21 Claims, 12 Drawing Sheets

LIGHTING APPARATUS WHOSE LIGHT EMITTING ELEMENTS ARE HARD TO BE TAKEN OFF

This application is based on application No. 2001-284107 filed in Japan, the contents of which are hereby incorporated by reference.

BACKGROUND OF THE INVENTION

1. Field of the Invention

The present invention relates to a lighting apparatus on which light emitting elements are mounted, and in particular, to a lighting apparatus that can be bent.

2. Description of Background Art

A light emitting diode (hereinafter simply "LED") is seen as a candidate for a light source of the next generation since an LED has a compact body, a long life-span, and can be expected to have a high luminous efficiency in the future. One application form of LED is to apply an LED lighting apparatus on a surface of a cylindrical column, for the purpose of using the column as an illumination lamp. It is necessary to bend the lighting apparatus along the surface of the column in order to realize this application.

However, simple soldering of LED on a flexible substrate also bends an area of a flexible substrate on which an LED is to be mounted (hereinafter simply "LED-mounted area"). This makes the solder to be taken off, which then causes a break between the LED and the wiring pattern, or causes the LED itself to be taken off from the flexible substrate.

Taking this problem into consideration, a technique has been proposed for forming a material-thick area on a flexible substrate by injection molding, to mount an LED thereon, as described in a Japanese laid-open patent application H11-163412. Using this technique, an LED-mounted area is reinforced with the material-thick area, and will not be deformed when the flexible substrate is bent.

However, such a conventional lighting apparatus, having an extra material-thick area on the flexible substrate, is expensive for the expense of material for forming the material-thick area, as well as becomes heavy by the weight of the material-thick area. The increase both in cost and weight is against market needs for decreasing price and weight. Especially the weight increase will end up requiring reinforcement of the mounting means used for the lighting apparatus, as well as the decrease in operability in mounting.

SUMMARY OF THE INVENTION

The object of the present invention, in view of the above-described problems, is to provide a lighting apparatus having a reinforced area of a flexible substrate on which light emitting elements are mounted, without increasing weight as a whole.

The above object is achieved by the structure of a lighting apparatus including: a flexible substrate having, on one main surface, a plurality of element-mounted areas, the plurality of element-mounted areas being formed by press-forming so as to be either concave or convex relative to the main surface; and a plurality of light emitting elements that are arranged on the plurality of element-mounted areas so that at least one light emitting element is mounted on each one of the element-mounted areas.

According to the above structure, rigidity will be enhanced at the element-mounted areas, by reinforcing the areas of the substrate on which light emitting elements are mounted, without accompanied by a weight increase. Therefore it becomes possible to bend the areas between the element-mounted areas, not the element-mounted areas themselves. This evades a break at the time of light emission, and avoids the light emitting elements from being taken off from the substrate.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENTS

The following is a description of the embodiments of the lighting apparatus which relates to the present invention, with reference to the drawings.

First Embodiment

1. Structure of Lighting Apparatus

Figure 1:
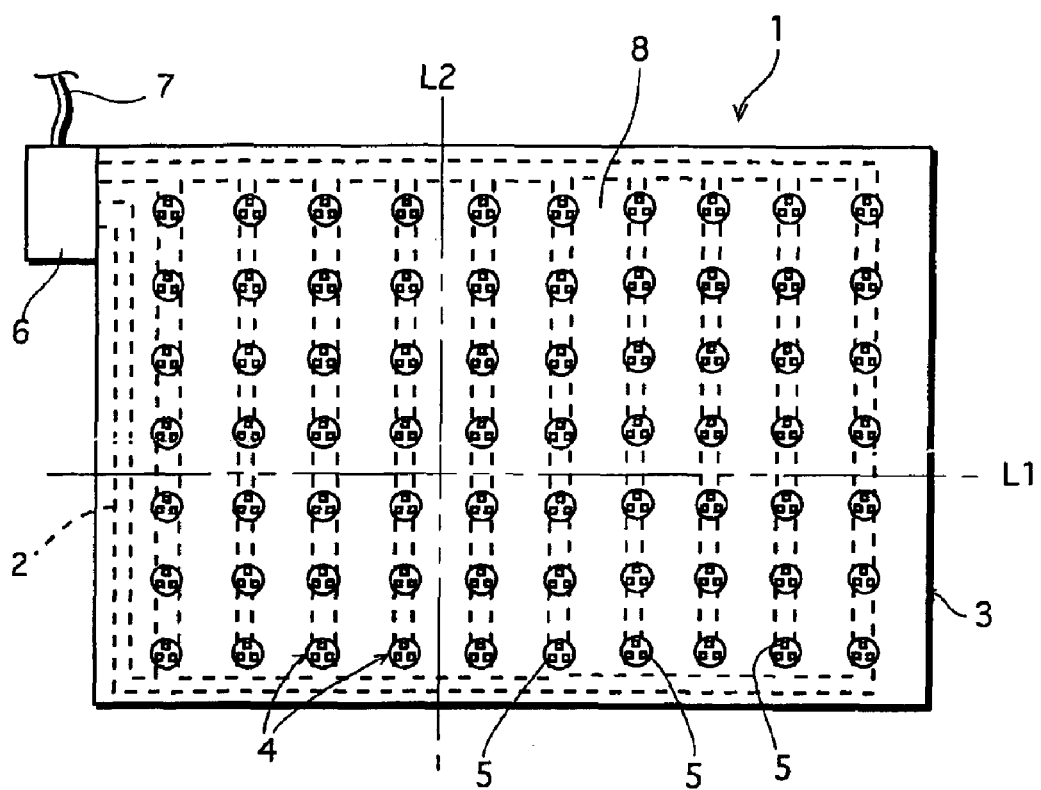
FIG. 1 is a plan view showing an entire lighting apparatus according to the first embodiment of the present invention.

FIG. 1 is a plan view showing an entire body of the lighting apparatus which relates to the first embodiment of the present invention. The lighting apparatus 1 comprises, as shown in FIG. 1, a substrate 3 having a wiring pattern 2 on the surface, a plurality of LEDs 5 that are arranged on the wiring pattern 2 of the substrate 3, a feeding terminal 6 which is connected to the wiring pattern 2, and a feeding cable 7 for feeding the feeding terminal 6. The feeding path for the plurality of LEDs 5 is: a power source (not shown in figures)→the feeding cable 7→the feeding terminal 6→the wiring patterns 2 through which the light-emission is performed.

The substrate 3 is a thin plate having substantially rectangular shape, for example, and is formed using a material having flexibility and is deformable, such as a glass epoxy (glass fiber reinforcing plastic). A plurality of areas of the substrate 3 are pressed in the direction of the normal to the substrate 3 (i.e. direction of thickness), so as to form concaves 4 that are element-mounted areas. The plurality of concaves 4 are arranged in a matrix form with a regular interval between each other, in both the vertical and horizontal directions. Hereinafter, areas of the substrate 3 that are not concave are referred to as "non-processed areas 8." In the first embodiment, all the element-mounted areas are made up of the concaves 4.

The wiring pattern 2 made of a thin layer of copper may be formed by various conventional methods such as etching for example. One end of the feeding cable 7 which situates at the opposite side of the feeding terminal 6 is connected to a controller (not shown in figures). This controller rectifies alternating current supplied from the commercial power source into direct current, which then is adjusted to have adequate voltage for each LED 5.

Note that the feeding terminal 6 is used to electrically connect an end of the feeding cable 7 which is on the opposite side of the controller with both of the beginning/end of the wiring pattern 2 of the substrate 3. The feeding cable 7 is connected to a crimp contact at the one end for example. Through this crimp contact connects, the feeding cable 7 is connected with the wiring pattern 2 of the feeding terminal 6.

Figure 2:
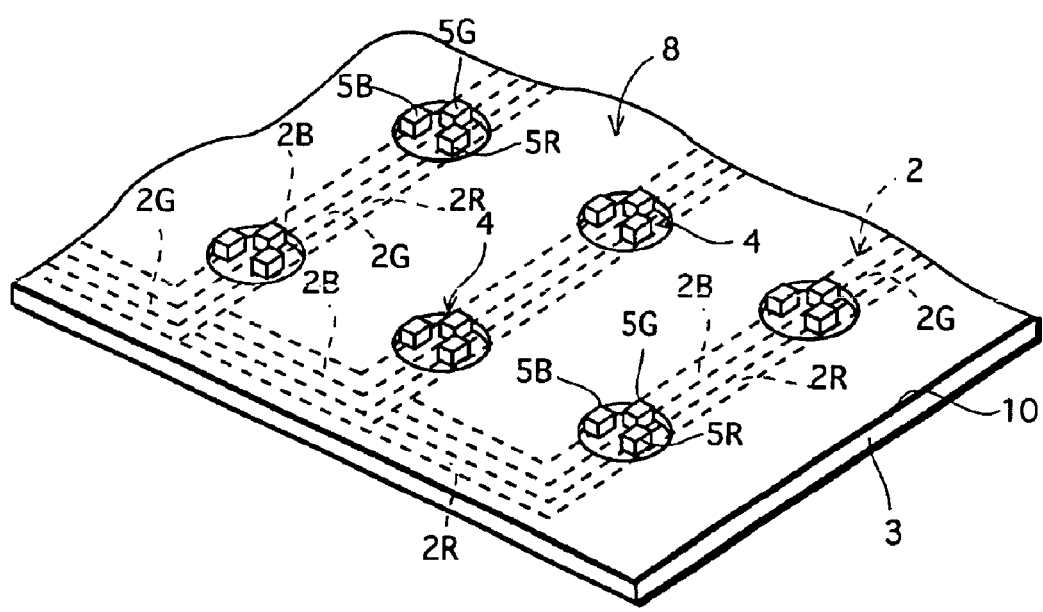
FIG. 2 is a perspective illustration of a part of the substrate 3.

FIG. 2 is a perspective illustration of a part of the substrate 3. The wiring pattern 2 is provided longitudinally so that it goes through each surface of the concaves 4 that are arranged in the longitudinal direction. A protective layer 10 (shown in FIG. 5) is provided on the substantially whole surface of the substrate 3, except for the LED 5-mounted area, for protecting the wiring pattern 2. This protective layer 10 is made of a resist such as a novolak resin, polyvinylphenol, and the like.

Mounted on each concave 4 are three LEDs 5, as shown in FIG. 2. Emitting colors for the three LEDs 5 are red (R), green (G), and blue (B) respectively. Hereinafter, each of R, G, B that respectively shows the emitting color followed by a number that identifies each component indicates a reference number for the component. For example, LEDs 5R, 5G, and 5B are situated inside the concave 4 in this order from the right in the example of FIG. 2, and are connected to the wiring pattern 2R, 2G, and 2B respectively.

Figure 3:
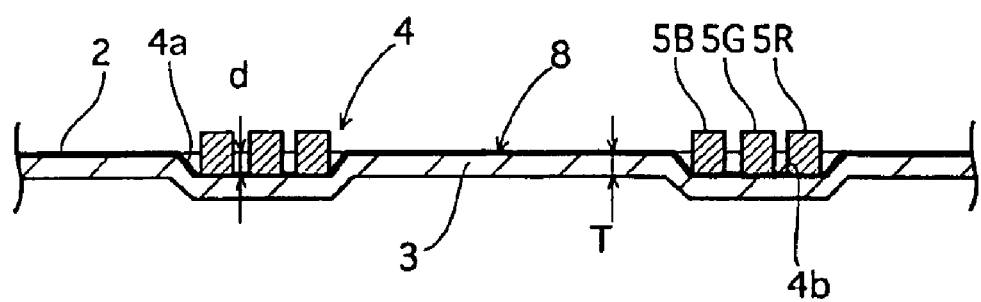
FIG. 3 is an enlarged sectional view of the substrate 3.
Figure 4:
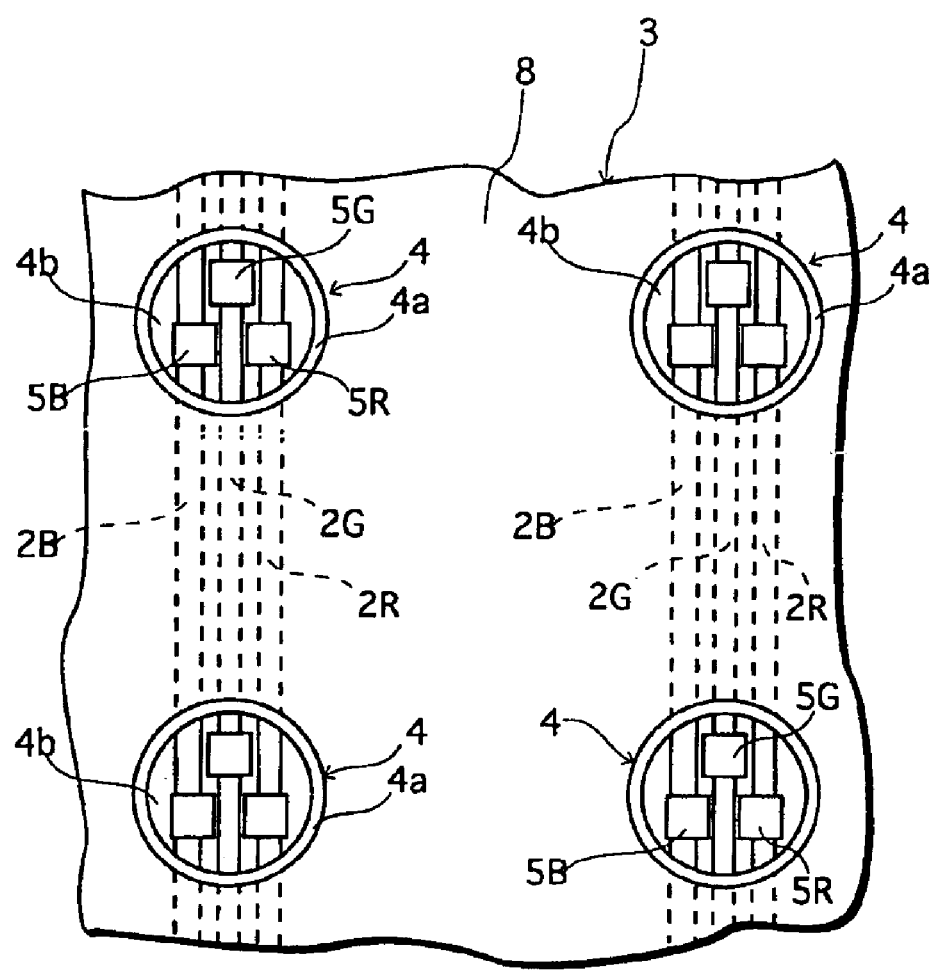
FIG. 4 is an enlarged plan view of the substrate 3.

FIG. 3 is an enlarged sectional view of the substrate 3, and FIG. 4 is an enlarged plan view thereof. The three LEDs 5R, 5G, and 5B are each arranged inside each concave 4, so as to form a vertex of a triangle. The top end of each LED 5R, 5G, and 5B outstands and is taller than the surface of the non-processed area 8 of the substrate 3, so that the side surface 4a of the concave 4 will not obstruct the lights emitted from the top end of the LED 5R, 5G, and 5B.

When viewed from the surface on which the LED 5 is mounted, the concave 4 is concave toward the direction of the thickness, and is substantially in a shape of a truncated cone at the top. That is, the concave 4 is shaped substantially as a truncated cone at the top, which has the main axis in the direction of the normal to the substrate 3 and which tapers off as the cone becomes distant from the surface of the substrate 3. According to this structure, the substrate 3 can be easily taken out from the mold, after the substrate 3 has been pressed to form the concave 4. Furthermore, the bottom surface 4b of the concave 4 is a flat plane which is approximately parallel to the non-processed area 8 of the substrate 3. On this flat plane, LEDs 5R, 5G, and 5B are mounted.

The depth "d" from the top surface of the non-processed area 8 to the bottom surface 4b of the concave 4 (shown in FIG. 3) is preferably in a range of 30%–100% of the thickness "T" of the non-processed area 8 of the substrate 3. This is because if the depth "d" of the concave 4 exceeds 100% of the thickness "T", it becomes difficult to form the concave 4, and if 30% or smaller, the concave 4 becomes too shallow in depth and its reinforcing effect will be reduced.

The concrete value for the thickness "T" adopted in this embodiment is approximately 0.2 mm, and the value for the depth "d" is approximately 0.1 mm which is approximately 50% of the thickness "T" (0.2 mm). Note that the thickness of the wiring pattern 2 of the substrate 3 is not included in the thickness "T".

Figure 5:
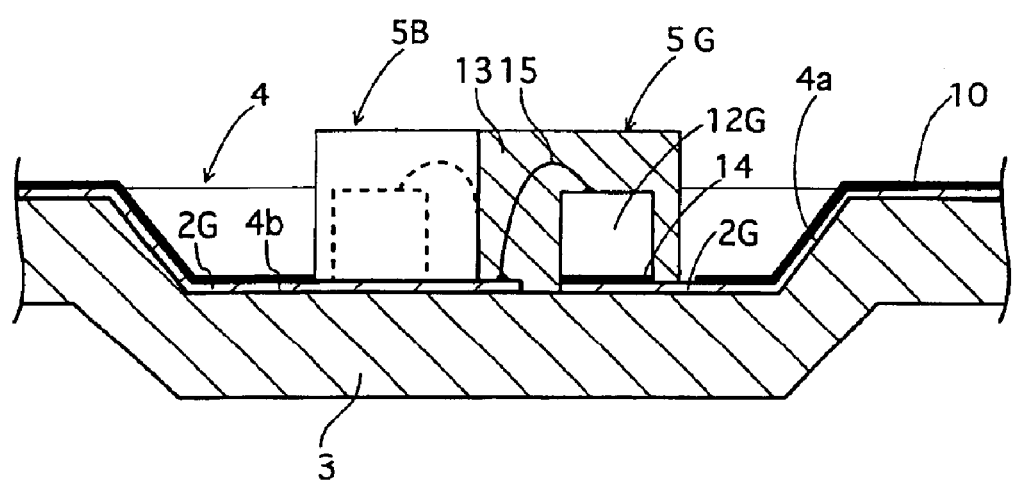
FIG. 5 is an enlarged sectional view of the part on which LED 5G is mounted.

FIG. 5 is an enlarged sectional view of the area on which LED 5G is mounted. The LED 5G comprises a bear chip 12G that emits green light and a sealing member 13 that seals the bear chip 12G. A cathode electrode at the bottom of the bear chip 12G is both electrically and mechanically connected, by means of a silver paste 14, to the cathode side of the wiring pattern 2G which is provided Au-plating (not shown in figures), and an anode electrode at the top of the bear chip 12G is connected, by means of a gold wire 15, to the anode side of the wiring pattern 2G. Under the mentioned condition, the bear chip 12G is sealed by the sealing member 13. Note that the LED 5R, 5B have a similar structure as the LED 5G, in which the respective bear chips 12R and 12B are connected to the corresponding wiring patterns 2R, and 2B, and sealed by the sealing member 13.

The sealing member 13 is made of a synthetic resin, such as an epoxy resin, an acryl resin, polycarbonate, and the like. Preferably, the synthetic resin should be highly heatproof, considering the heat that results from the light emission of the LED 5.

2. Production Method

Figure 6A:
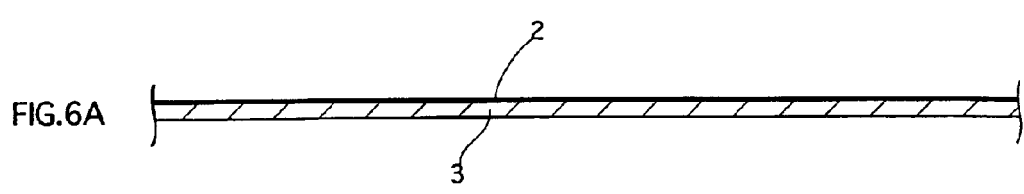
FIGS. 6A, 6B, and 6C are schematic diagrams for explaining processes of providing the substrate 3 with LEDs.
Figure 6B:
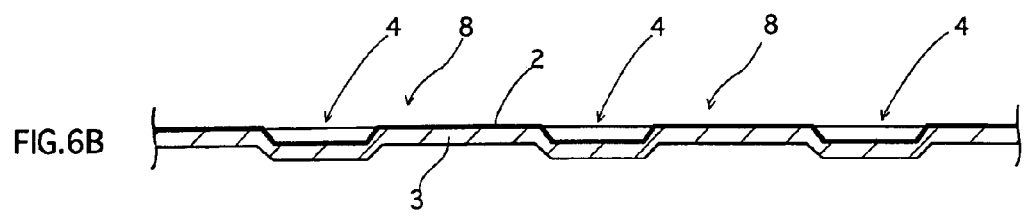
Figure 6C:
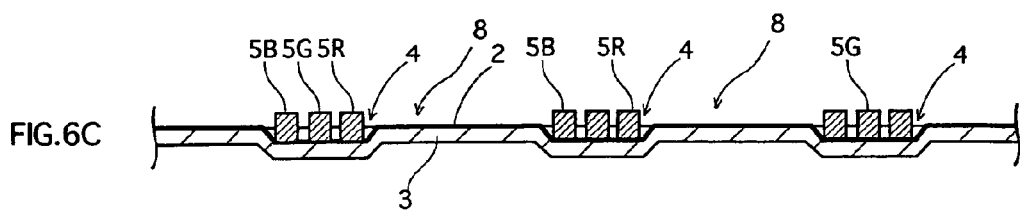

FIG. 6 is a schematic diagram for explaining processes of making the concave 4 on the substrate 3 which has been provided the wiring pattern 2, and of arranging the LEDs 5R, 5G, and 5B in the concave 4. Note that the method of forming the wiring patterns 2R, 2G, and 2B on the substrate 3 as well as mounting of the LEDs 5R, 5G, and 5B are conventional ones, whose description is omitted here.

First, the substrate 3 is prepared on which the wiring pattern 2 and a protective layer (not shown in figures) are formed, as shown in FIG. 6A. Next, a plurality of concaves 4 are formed, by a press forming, at positions on the substrate 3 that correspond to where the LEDs 5R, 5G, and 5B should be formed.

The molds that should be used in this press forming are comprised of a male mold and a female mold; the male mold has a convex portion which situates at a position corresponding to the concave 4 on the substrate 3 and which is in a shape of a truncated cone at the top, and the female mold has a concave portion which situates at a position corresponding to the concave 4 on the substrate 3 and which is in a shape of a truncated cone. First, the substrate 3 is set between the male mold and the female mold, and the male mold is pressed using a press machine used for press-forming for example, in order to perform plastic-deformation on the substrate 3 according to the shapes of the male/female molds, which results in a plurality of concaves 4 as shown in FIG. 6B. Note that the depth of each concave 4 is adjusted such that the wiring pattern 2 will not be broken when the concaves 4 are being formed.

Next, bear chips 12R, 12G, and 12B are connected and mounted to the respective wiring patterns 2R, 2G, and 2B situating on the surface of the concaves 4 by means of a silver paste 14 and the gold wire 15. The bear chips 12R, 12G, and 12B are then sealed by a synthetic resin to form a sealing member 13.

The substrate having undergone the above mentioned press forming results in forming the concaves 4. The mentioned method of forming the concaves 4 does not necessitate a pre-processing (such as surface treatment or degreasing etc.) which used to be necessary for the conventional lighting apparatus in which an injection molding has been used in forming a material-thick area. Moreover, the above method does not necessitate, at the end of the series of operations, a burring processing for removing the burrs spilled out along the substrate between the material-thick areas at the time of injection molding.

Further, it used to take time for electrically connecting LEDs and a substrate since they are normally placed in a separate position from each other due to the material-thick area which is placed between an LED and the wiring pattern on the substrate surface. However, the above structure enables to mount each LED 5R, 5G, and 5B on the wiring pattern 2R, 2G, and 2B of the concave 4, which makes it easier to connect the LED 5R, 5G, and 5B to the wiring pattern 2R, 2G, and 2B compared to the conventional techniques.

3. Mounting Lighting Apparatus

Figure 7:
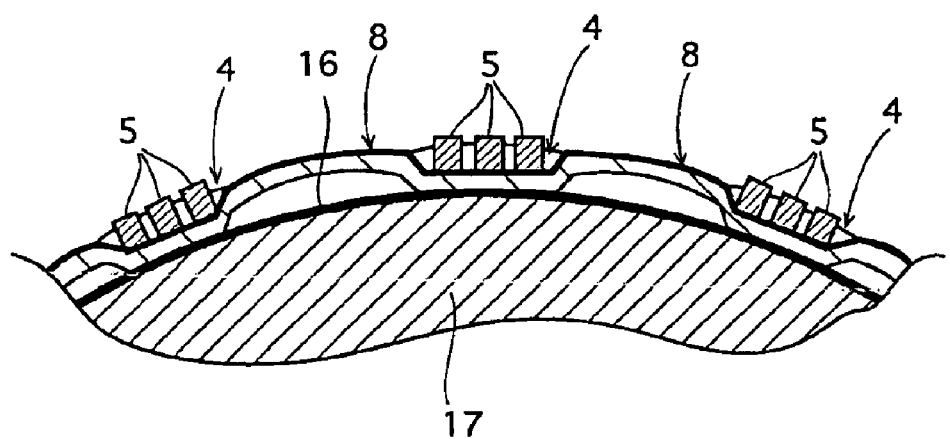
FIG. 7 is a schematic transverse sectional view showing an example of a lighting apparatus mounted on a column 17 which is shaped in a cylindrical form.

FIG. 7 is a schematic transverse sectional view showing an example of a lighting apparatus mounted on a column 17 which is shaped in a cylindrical form. As shown in FIG. 7, the substrate 3 is mounted on a surface of the column 17 with a heat-dissipation plate 16 in-between, with a surface on which the LEDs 5R, 5G, and 5B are mounted being an outside surface. The mounting means used therefor is such as a screw or adhesives (not shown in figures).

The heat-dissipation plate 16 is for dissipating a heat generated when the LEDs 5R, 5G, and 5B emit light, and is a metal plate made of stainless for example.

Since the substrate 3 is made of a flexible material as seen in FIG. 7, it can be attached to a surface of the column 17 in a manner so as to conform with the shape of the surface, even the surface is bent in an arc shape.

The concave 4 of the substrate 3 is formed as a result of press-forming the substrate 3. This makes the concaves 4 to be stiffer than the non-processed area 8. As a result, when the substrate 3 is mounted on a mounting surface of the column 17 in a bent condition, the bottom 4b of the concave 4 will be hardly bent; only the non-processed area 8 will be bent. Accordingly, a load is rarely imposed on the silver paste 14 or on the gold wire 15, which are for connecting the LEDs 5R, 5G, and 5B to the substrate 3 both electrically and mechanically.

The plurality of concaves 4 are arranged regularly in a matrix form on the substrate 3. Therefore, the substrate 3 can be bent in a convex form at a virtual line L1(FIG. 1) which elongates between the concaves 4 arranged in the lateral direction. Likewise, the substrate 3 can be bent in a convex form at the virtual line L2 (FIG. 1) that elongates between the concaves 4 arranged in the longitudinal direction. Note that the substrate 3 may be also bent in a concave form at the virtual line L1 or L2. Moreover, the position of the virtual lines L1 and L2 are one example, and can be placed in a different position as long as it is between and along the concaves 4.

Second Embodiment

Figure 8:
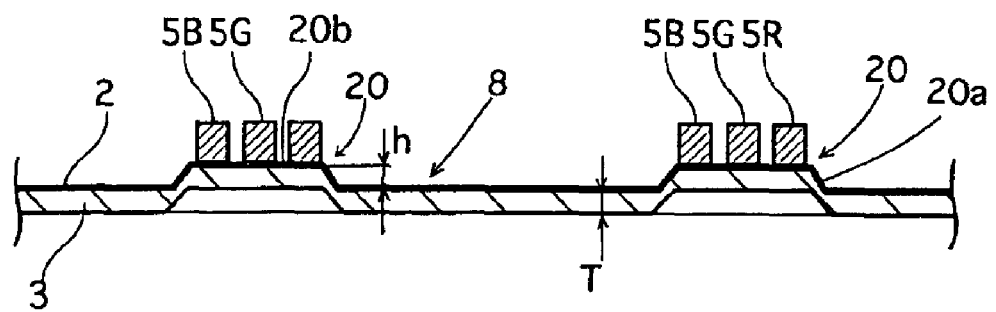
FIG. 8 is an enlarged sectional view showing the second embodiment of the present invention.

FIG. 8 is an enlarged sectional view showing the second embodiment of the present invention. In the first embodiment, the concaves are formed, which are concave relative to the substrate 3, by press-forming the substrate 3. In the second embodiment, however, a plurality of convexes 20 are formed, as the element-mounted parts, (see FIG. 8) by press-forming the substrate 3. And on a surface of the convex, LEDs 5R, 5G, and 5B are formed with wiring patterns 2R, 2G, and 2B in-between. Note that the substrate 3, the LEDs 5R, 5G, and 5B, and so on are the same as the ones found in the first embodiment, which will be assigned same respective numbers and will not be detailed in the following description.

Figure 9:
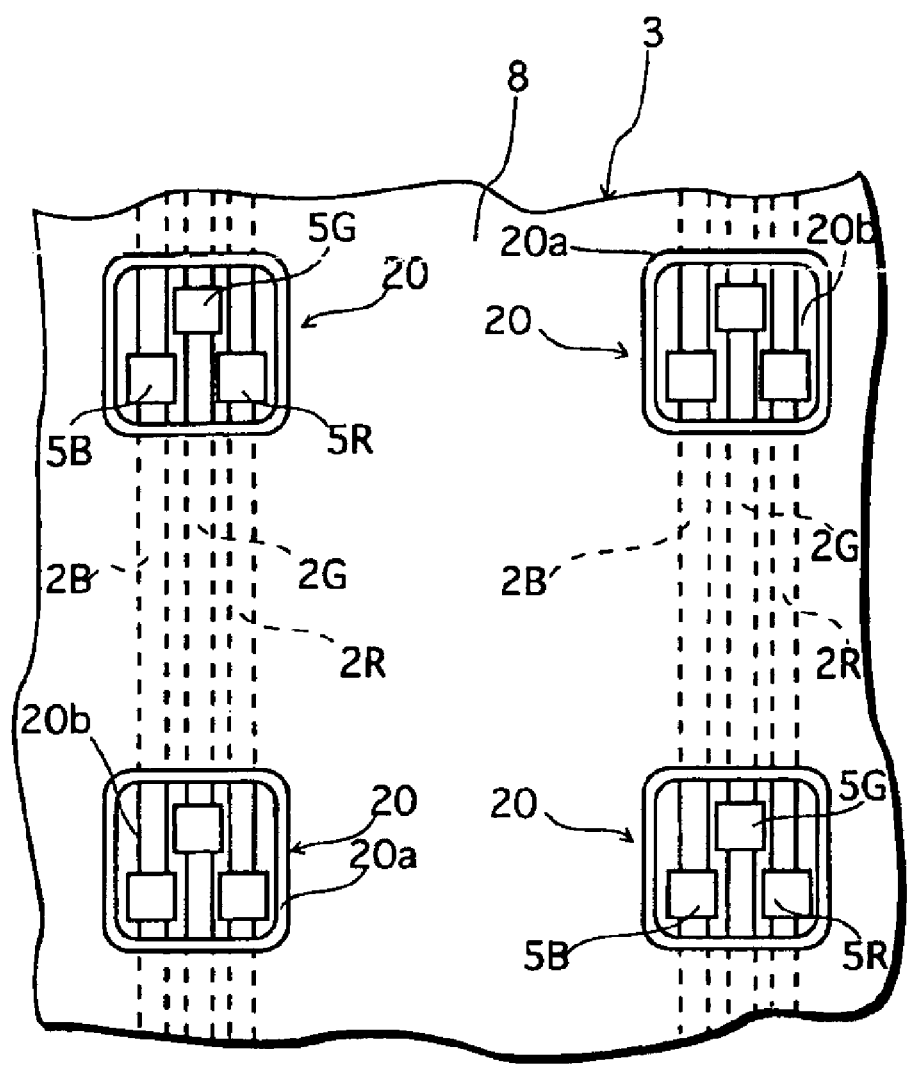
FIG. 9 is an enlarged plan view of the substrate 3.

FIG. 9 is an enlarged plan view of the substrate 3. Each convex 20 is formed on a LED 5-mounted surface of the substrate 3, in such a way that the convex 20 bulges out in the direction of the normal to the LED 5-mounted surface. The convexes 20 bulges out substantially in a shape of a truncated pyramidal form which has a rectangular-shaped bottom and which becomes thinner as it is remote from the surface of the substrate (FIG. 8). Therefore, the upper surface 20b of the convex 20 is a flat plane which is substantially parallel to the non-processed area 8 of the substrate 3. On this flat plane, LEDs 5R, 5G, and 5B are mounted.

The four corners of each convex 20 are in the shape of a segment of a circle, when seen from the above. This is for preventing concentration of stress on these corners, when the substrate 3 is being bent. The plurality of convexes 20 are arranged in a matrix form with equal intervals in-between in both of longitudinal and lateral directions. Note that the three LEDs 5R, 5G, and 5B are arranged so that they each form a vertex of a triangle in a predetermined order, as in the first embodiment.

The "h" (shown in FIG. 8) which is a height measured from the top surface of the non-processed areas 8 on the substrate 3 up to the top surface 20b of the convexes 20 is preferably in a range of about 30%~100% of the thickness "T" at the non-processed areas 8. This is because it becomes difficult of form the convexes 20 if the "h" is no smaller than 100% of the thickness "T"; and if it is no greater than 30%, the reinforcing effect of the convexes 20 will be too small due to the reduction in its height. Specifically the height "h" is formed to be 0.1 mm, which is about 50% of the thickness "T" which is 0.2 mm.

Figure 10:
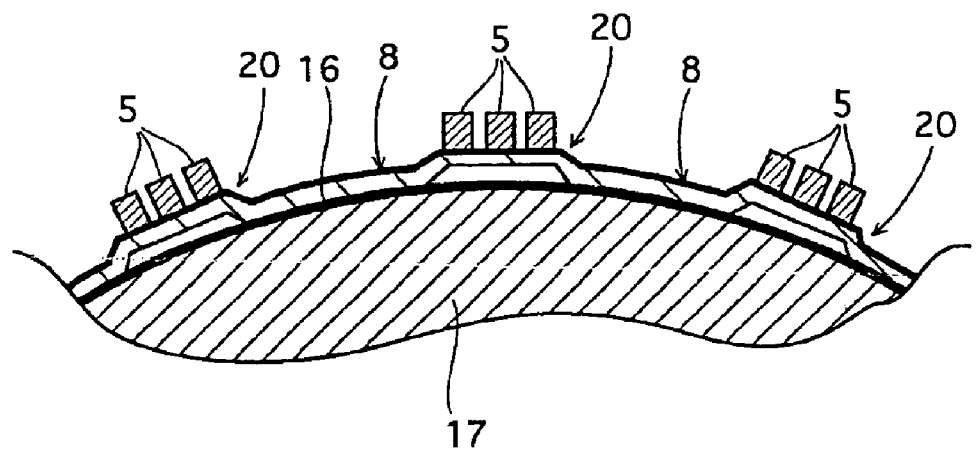
FIG. 10 is a schematic sectional view of an example of the lighting apparatus equipped on a surface of the column 17 which is in a cylindrical form.

FIG. 10 is a schematic sectional view showing an example of the lighting apparatus equipped on a surface of the column 17 which is in a cylindrical form. As shown in FIG. 10, the convexes 20 are formed for reinforcing the flexural rigidity of the substrate 3 at an area where the LED 5 is mounted. This has the same effect as the first embodiment in equipping the substrate 3 with the column 17 in a bent condition, which is to prevent bending on the top surface of the concaves 20, even in case that the substrate 3 as a whole will be bent by the non-processed area 8 being bent.

Note that concaves or convexes in each of the first and second embodiments are formed by press-forming. The reason for this is that using the press-forming method, the rear part of each concave becomes convex, and the thickness of the substrate where the concave is will be substantially the same as that of the non-processed area 8. This enhances the flexural rigidity at the concaves compared to the non-processed areas.

Variation

This is the end of description on the present invention according to each embodiment. It is to be noted that the present invention will not be confined to the concrete examples stated in the above embodiments. For example, the following variant examples are also possible.

Figure 11:
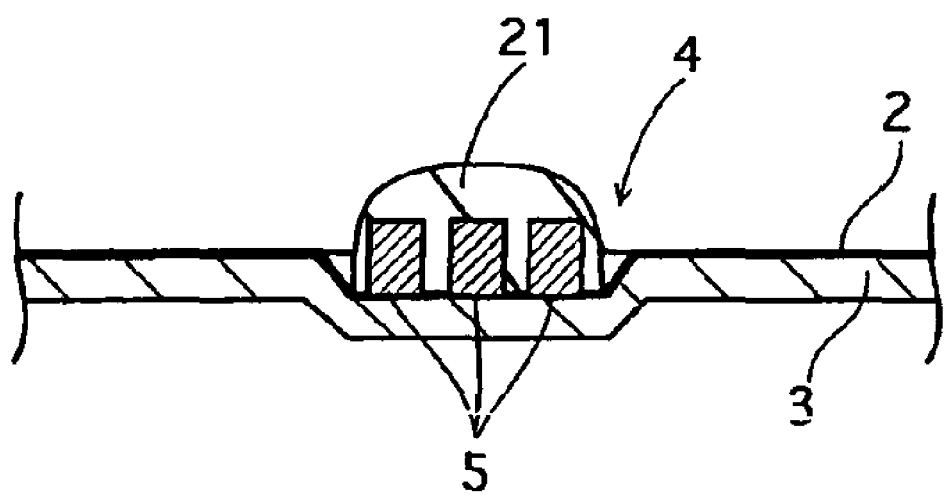
FIG. 11 is a sectional view showing a variation example in which a lens is equipped in the concave.

(1) In each of the above embodiments, an optical means has not been equipped on LED 5. However, as shown in FIG. 11, it is possible to provide a lens 21 for the concaves 4 with which this LED 5 has been provided. The lens 21 is provided so that it covers the entire LED 5 provided in the concave 4. The lens 21 bulges out from the bottom 4b of the concave 4 toward the upper side in such a way so as to be in a hemispherical form.

Having such a lens 21 as in the above, a part of the light emitted from each LED 5R, 5G, and 5B will mix each other by being reflected inside the lens 21 and at the boundary of the air, which will have, to a certain extent, an effect of reducing unevenness of color. To even more alleviate unevenness of color, it is preferable to mix a powdery substance that has an effect of scattering light, such as silica and so on.

(2) In the above embodiments, LED 5 is used whose wire-bonded bear chip 12 is sealed by the sealing member 13. However, the bear chip may be flip chipped, or a surface mounted device (SMD) type of LED will equally do. Specifically, when adopting a flip chipping method, the bottom part of the bear chip can be connected to the wiring pattern via a bump in the form of a metal ball. When adopting an SMD type LED, a soldering method can be used in connecting an electrode situating at the side of the LED and the wiring pattern.

(3) In the above embodiments, a plan view of the concaves 4 and that of the convexes 20 are either in a circular form or in a rectangular form. However, other forms are also possible. Specifically, they may be formed as a polygonal form, or in an oval form.

Figure 12:
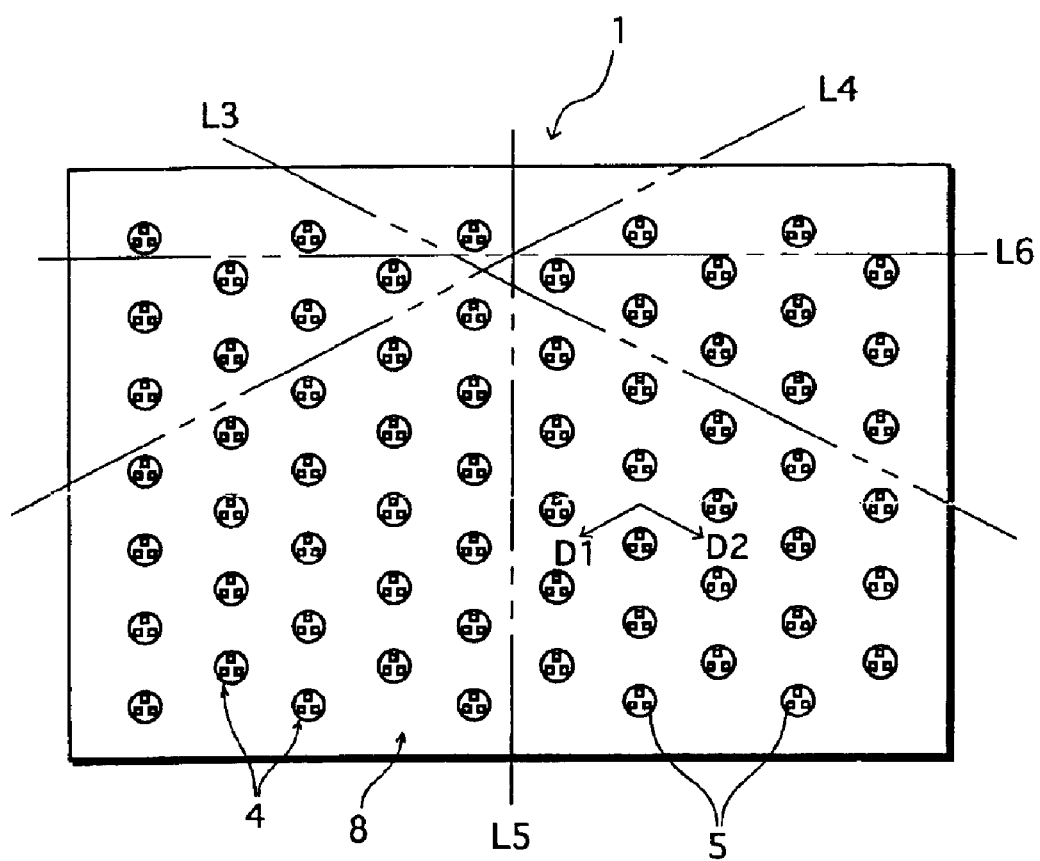
FIG. 12 is a plan view showing a variation example in which a plurality of concaves are provided on the substrate, the concaves being formed in two directions intersecting each other at a predetermined angle with equal intervals.

(4) In the above embodiments, the concaves 4 or the convexes 20 are formed in a matrix form having equal intervals therebetween both in two orthogonal directions (i.e. longitudinal and lateral), so as to bend the substrate either in a longitudinal or a lateral direction between the neighboring concaves or convexes either in concave/convex forms. However, as shown in FIG. 12, the concaves 4 and the convexes 20 may also be formed having equal intervals therebetween in two directions that are not orthogonal with each other (D1 and D2 directions). By being arranged in the above way, the substrate can be bent in slanting directions (i.e. D1 and D2) in the area which situates between neighboring concaves 4 or between neighboring convexes 20. That is, it is possible to bend the substrate in convex/concave forms at the imaginary line L3 or L4.

Further, if the intervals between the neighboring concaves 4 or between the convexes 20 are arranged to be bigger, it becomes possible to bend the substrate 3 at the imaginary lines L5 or L6 also either in convex or concave forms. By enlarging the intervals, the substrate 3 will be able to be bent in more directions. This makes it possible to bend the substrate in different directions although it has a plurality of number of LEDs 5 on the surface.

(5) In the above embodiments, three LEDs having different colors from each other: 5R, 5G, and 5B are arranged in a triangular form. However, if the area of the bottom surface of the concaves 4 is large enough, it is possible to arrange the three LEDs in a linear position. Also, a plurality of sets of the LED 5R, 5G, 5B are possible to be arranged in one concave 4, such as two sets for example. Further, the concaves 4 may be provided with LEDs that mutually emit the same colored light. This also applies to the concaves 20.

(6) In the first embodiment, all the concaves 4 are each provided with three LEDs (i.e. 5R, 5G, and 5B). Likewise in the second embodiment, all the convexes 20 are each provided with three LEDs 5R, 5G, and 5B. However in this invention, there may be concaves 4 or convexes 20 that are not provided with any LED. As one example thereof, the four concaves 4 each positioned at the four respective corners of the substrate 3 may not be provided with any LED. Likewise, the four convexes 20 each positioned at the four respective corners of the substrate 3 may not be provided with any LED.

Although the present invention has been fully described by way of examples with reference to accompanying drawings, it is to be noted that various changes and modifications will be apparent to those skilled in the art. Therefore, unless such changes and modifications depart from the scope of the present invention, they should be construed as being included therein.

What is claimed is:

1. A lighting apparatus comprising:
    a flexible substrate of substantially the same thickness having, on one main surface, a plurality of element-mounted areas, the plurality of element-mounted areas being formed by press-forming so as to be either concave or convex relative to the main surface, the element-mounted areas in either the concave portion or the convex portion have a distance, d, from either the main surface to a bottom surface of the concave portion or an upper surface of the convex portion that is within a range of 30% to 100% of the thickness, t, of the substrate to fulfill the following condition:

$$t \geq d \geq 0.3t$$

and;
    a plurality of light emitting elements that are arranged on the plurality of element-mounted areas.

2. The lighting apparatus of claim 1,
    wherein the plurality of light emitting elements are arranged on the plurality of element-mounted areas so that at least one light emitting element is mounted on each one of the element-mounted areas.

3. The lighting apparatus of claim 2,
    wherein each of the element-mounted areas has a flat portion which is substantially parallel, when the flexible substrate is not in a bent condition, to areas of the main surface that are other than where the element-mounted areas are provided, and the at least one light emitting element is mounted on the flat portion.

4. The lighting apparatus of claim 2, further comprising a wiring pattern which extends up to a surface of each of the element-mounted areas,
    wherein power is supplied to the light emitting elements through the wiring pattern.

5. The lighting apparatus of claim 1,
    wherein mounted on each one of the element-mounted areas are two or more light emitting elements.

6. The lighting apparatus of claim 5,
    wherein the two or more light emitting elements mounted on each one of the element-mounted areas include at least two light emitting elements that emit mutually different colored lights.

7. The lighting apparatus of claim 6,
    wherein each of the light emitting elements is an LED.

8. The lighting apparatus of claim 7,
    wherein each one of the plurality of element-mounted areas is provided with three LEDs that emit light in red, green, and blue, respectively.

9. The lighting apparatus of claim 8,
    wherein the three LEDs are each arranged in a position substantially corresponding to three vertexes of a regular triangle respectively.

10. The lighting apparatus of claim 9,
    wherein the plurality of element-mounted areas make up a plurality of concaves that are concave relative to the flexible substrate.

11. The lighting apparatus of claim 9,
wherein the plurality of element-mounted areas make up a plurality of convexes that are convex relative to the flexible substrate.

12. The lighting apparatus of claim 1,
wherein the plurality of element-mounted areas are arranged to have substantially equal intervals therebetween in two directions.

13. The lighting apparatus of claim 12,
wherein the plurality of element-mounted areas are arranged substantially in a matrix form.

14. The lighting apparatus of claim 1,
wherein each of the light emitting elements is an LED.

15. In a lighting apparatus having a plurality of light emitting elements mounted thereon, the improvement comprising:
a flexible substrate that is bent to a non-planar configuration having a plurality of element-mounted areas, the plurality of element-mounted areas are positioned at an offset from the non-element mounted areas and are stiffer than the non-element mounted areas wherein bending of the flexible substrate will occur primarily in the non-element mounted areas and the light emitting elements mounted on the element-mounted area will be subject to less stress, wherein a distance, d, from a surface of the non-element mounted areas to a surface of the element-mounted areas is within a range of 30% to 100% of a thickness, t, of the substrate.

16. The lighting apparatus of claim 15 wherein the thickness of the flexible substrate in the non-element mounted areas between the offsets of the non-element mounted areas and the element-mounted areas beneath the light emitting elements are substantially the same.

17. The lighting apparatus of claim 16 wherein the flexible substrate is a glass fiber reinforcing plastic that has been pressed to form the plurality of element-mounted areas that are offset and parallel to the non-element mounted areas.

18. A light apparatus comprising:
a flexible substrate of a relatively constant thickness having a plurality of element-mounted areas and a plurality of integral non-element mounted areas connecting the plurality of element-mounted areas;
a plurality of light emitting elements mounted in each of the element-mounted areas;
means for providing power to activate the light emitting elements;
a non-planar support member, wherein the flexible substrate is bent to conform to the non-planar support member and fastened to the non-planar support member and the plurality of element-mounted areas beneath the light emitting elements are positioned at an offset from the non-element mounted areas and are stiffer than the non-element mounted areas wherein bending of the non-planar support member will occur primarily in the non-element mounted areas to conform to the non-planar support member; and
curvilinear corners are provided at the interface of the plurality of element mounted areas and the plurality of non-element mounted areas to prevent concentration of stress.

19. The lighting apparatus of claim 18 further including a heat-dissipation plate contacting the non-planar support member and the flexible substrate.

20. The lighting apparatus of claim 18,
wherein mounted on each one of the element-mounted areas are two or more light emitting elements.

21. The lighting apparatus of claim 18,
wherein the plurality of element-mounted areas are arranged to have substantially equal intervals therebetween in two directions.

* * * * *